(12) United States Patent
Schuette et al.

(10) Patent No.: US 7,323,899 B2
(45) Date of Patent: Jan. 29, 2008

(54) SYSTEM AND METHOD FOR RESUMED PROBING OF A WAFER

(75) Inventors: Glenn E Schuette, Allen, TX (US);
James E Rousey, Lucas, TX (US);
Curtis E Miller, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/551,097

(22) Filed: Oct. 19, 2006

(65) Prior Publication Data

US 2007/0080705 A1    Apr. 12, 2007

Related U.S. Application Data

(62) Division of application No. 10/864,976, filed on Jun. 10, 2004, now Pat. No. 7,148,716.

(51) Int. Cl.
  *G01R 31/26* (2006.01)
  *G01R 31/02* (2006.01)
(52) U.S. Cl. .................. 324/765; 324/754; 324/764
(58) Field of Classification Search .................. None
  See application file for complete search history.

(56) References Cited

U.S. PATENT DOCUMENTS

| 4,500,836 A | 2/1985 | Staudacher |
| 5,550,480 A | 8/1996 | Nelson et al. |
| 5,892,686 A | 4/1999 | Iijima |
| 5,917,332 A * | 6/1999 | Chen et al. .................. 324/765 |
| 5,943,551 A * | 8/1999 | Schemmel et al. ........... 438/14 |
| 6,140,828 A | 10/2000 | Iino et al. |
| 6,166,552 A | 12/2000 | O'Connell |
| 6,262,586 B1 | 7/2001 | Furasawa |
| 6,477,685 B1 | 11/2002 | Lovelace |

* cited by examiner

*Primary Examiner*—Paresh Patel
(74) *Attorney, Agent, or Firm*—Yingsheng Tung; Wade James Brady, III; Frederick J. Telecky, Jr.

(57) ABSTRACT

According to one embodiment of the invention, a method for resuming the probing of a wafer includes identifying a data set associated with a wafer. The data set identifies at least one unprobed die supported on the surface of the wafer. The method also includes determining that the data set associated with the wafer is useable and generating a probe map of the wafer from the data set. The probe map identifies a physical position associated with each unprobed die supported on the surface of the wafer. The probe map and one or more probe commands are communicated to a probe module to drive the probe module in resuming the probe of the wafer.

4 Claims, 3 Drawing Sheets

SYSTEM AND METHOD FOR RESUMED PROBING OF A WAFER

CROSS REFERENCE TO RELATED APPLICATIONS

This is a division of application Ser. No. 10/864,976 filed Jun. 10, 2004, now U.S. Pat. No. 7,148,716, the contents of which are herein incorporated by reference in its entirety.

TECHNICAL FIELD OF THE INVENTION

This invention relates in general to the testing of electronic components, and more particularly to a system and method for the probing of a wafer.

BACKGROUND OF THE INVENTION

An array of die, which may include integrated circuits and their components, are typically supported on a wafer during various semiconductor fabrication processes. At various stages during fabrication processes, it may be desirable to perform testing on each die to read information from each die, write information to each die, or otherwise gather information about each die and components on each die. During testing, a probe map is downloaded to a prober and is then used by the prober to position the wafer to sequentially align each die on the wafer with testing equipment.

Although it is generally desirable to test each die on the wafer in a single pass, or probing session, in certain situations the probing session may be aborted before every die on the wafer is tested. For example, a single probing session may require several hours of testing time. If a lot of higher priority wafers is received in the fabrication facility, a probing session of a lower priority wafer already underway may be aborted in favor of testing the lot of the higher priority wafers. In such a case, an operator of the probing and testing equipment may manually abort the probing session of the lower priority wafer. In other examples, a probing session may be automatically aborted at the occurrence of an unplanned event such as a test program crash. Regardless of the cause, when a probing session is aborted, the time spent performing the probing session and the data gathered from the probing session are typically lost. A later probing session requires the retesting of any already probed die on the wafer to regenerate the lost data. Because each probing session of a wafer results in wear to each die tested on the wafer, multiple probing sessions performed on a wafer may degrade the integrity of the wafer.

SUMMARY OF THE INVENTION

From the foregoing it may be appreciated by those skilled in the art that a need has arisen for a system and method for the probing of a wafer. In accordance with the present invention, a system and method for the probing of a wafer is provided that substantially eliminates or greatly reduces disadvantages and problems associated with conventional wafer testing equipment.

In one embodiment, a method for resuming the probing of a wafer includes identifying a data set associated with a wafer. The data set identifies at least one unprobed die supported on the surface of the wafer. The method also includes determining that the data set associated with the wafer is useable and generating a probe map of the wafer from the data set. The probe map identifies a physical position associated with each unprobed die supported on the surface of the wafer. The probe map and one or more probe commands are communicated to a probe module to drive the probe module in resuming the probe of the wafer.

Depending on the specific features implemented, particular embodiments of the present invention may exhibit some, none or all of the following technical advantages. Various embodiments may be capable of resuming a probing session of a wafer even after a prior probing session is aborted. The resumed probing session may utilize data that was gathered in the earlier aborted probing session. Accordingly, some embodiments may be capable of storing the data gathered about each die during the earlier probing session and using the stored data to determine the one or more die on the wafer that remain untested. As a result, only the untested die may be probed during the resumed probing session.

Other embodiments may be capable of resuming a probing session on a wafer even after multiple probing sessions have been attempted and aborted. Some embodiments may be capable of resuming the probing session using different probing and testing equipment than was used in the prior aborted probing sessions. Accordingly, where testing and probing hardware malfunctions, the probing of the wafer may be resumed using different testing and probing equipment. Additionally, a wafer may be partially probed at one facility, and the probing of the wafer resumed at a different facility.

Other embodiments may be capable of easily and quickly generating a probe map of the wafer since the data generated from any previously aborted probing sessions may be stored in a relational database. After multiple partial probing sessions are performed and the probing of the wafer is complete, the data gathered from each probing session may be merged for reporting purposes. Accordingly, problems associated with previous methods and systems for resumed probing of a wafer may be reduced, and the quality and functionality of the integrated circuit or other components supported on the wafer may be improved.

Other technical advantages will be readily apparent to one skilled in the art from the following figures, descriptions, and claims.

BRIEF DESCRIPTION OF THE DRAWINGS

For a more complete understanding of the invention and the advantages thereof, reference is now made to the following description, taken in conjunction with the accompanying drawings, wherein like reference numerals represent like parts, in which.

DETAILED DESCRIPTION OF EXAMPLE EMBODIMENTS OF THE INVENTION

Figure 1:
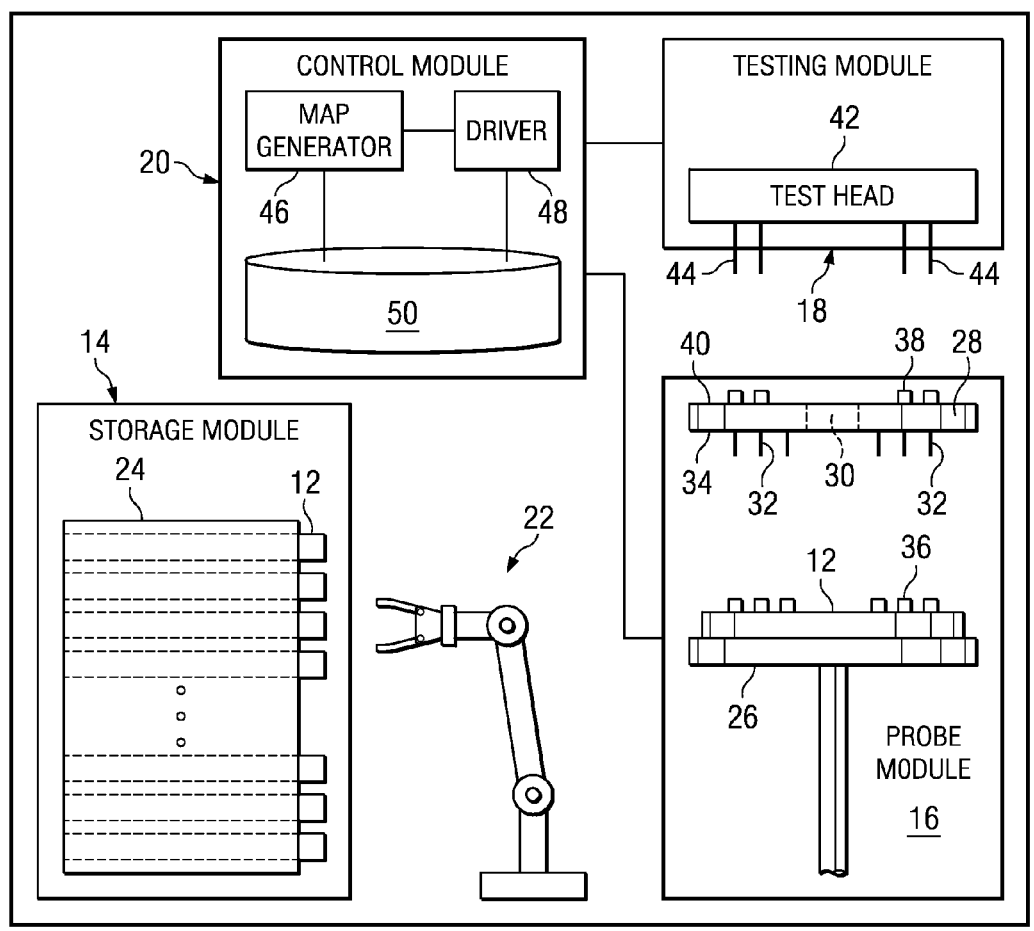
FIG. 1 is a block diagram of a system for the probing of a wafer after one or more partial probing sessions have been aborted.

FIG. 1 is a block diagram of a system 10 for the probing of a wafer 12 after one or more partial probing sessions have been aborted. In various embodiments, wafer 12 may include a thin polished slice of crystal material sliced from a crystal cylinder grown for the purpose of semiconductor fabrication. According to one typical fabrication technology, a wafer may be eight inches in diameter and provide the foundation on which a semiconductor device may be created. The semiconductor device may be created on the surface of the wafer using a variety of techniques and procedures, such as layering, photolithographic patterning, doping through implantation of ionic impurities, and heating. The starting material may comprise silicon, gallium arsenide, or other suitable substrate material. As will be described in further detail below, system 10 includes a storage module 14, a probe module 16, a testing module 18, and a control module 20 and may include any other modules appropriate for the gathering of testing data about the one or more die on wafer 12. In particular embodiments, the different modules of system 10 cooperate to read data from, write data to, or otherwise gather information about each die on wafer 12. System 10 also includes a transfer assembly 22 for transporting wafer 12 between storage module 14 and probing module 16. Transfer assembly 22 may also be used to transport wafer 12 between other modules and components of system 10 and between system 10 and other semi-conductor fabrication systems.

Prior to the probing process, wafer 12 may be stored in storage module 14. Specifically, wafer 12 may be stored in one or more cassettes 24 within storage module 14. A cassette 24 may include any apparatus suitable for storing wafer 12 while undergoing or awaiting isolated semiconductor device production processes in system 10 and/or other components of semiconductor fabrication systems. In particular embodiments, cassette 24 may include multiple slots for horizontally storing stacked wafers. For example, cassette 24 may include twenty-five slots for storing twenty-five wafers. The described configuration of cassette 24, however, is merely exemplary. Cassette 24 may be of any configuration appropriate for storing any desired number of wafer. Although cassette 24 and storage module 14 are used to store wafer 12 while wafer 12 awaits probing and testing, cassette 24 and storage module 14 may also be used to store wafer 12 as wafer 12 undergoes other fabrication processes outside of system 10.

System 10 includes a transfer assembly 22 or other apparatus for mechanically or robotically moving wafer 12 from one component to another component in system 10. In various embodiments, transfer assembly 22 transports wafer 12 from storage module 14 to probe module 16. Probe module 16 includes a chuck 26 on which wafer 12 may be placed by transfer assembly 22. Chuck 26 includes a supportive structure that may be mechanically or robotically operated to move horizontally and vertically within probe module 16. A vacuum or other force may be applied to wafer 12 through chuck 26 to hold wafer 12 on chuck 26 while wafer 12 is in probe module 16. In operation, chuck 26 may be mechanically or robotically moved to position wafer 12 into a testing position such that data may be retrieved from or imported to wafer 12. More specifically, chuck 26 may be moved horizontally and vertically to sequentially position each die on wafer 12 in the testing position.

In the testing position, wafer 12 is positioned beneath a probe card 28 that includes circuitry components enabling probe card 28 to operate as an interface between wafer 12 and testing equipment in testing module 18. Probe card 28 is typically at a fixed location within probe module 16. Transfer assembly 22 may position wafer 12 in the testing position such that a particular die on wafer 12 is aligned with or positioned proximate to probe card 28. In particular embodiments, one or more pins 32 may extend from a first surface 34 of probe card 28 along an edge of aperture 30. In the testing position, each pin 32 contacts an associated pad 36 on the particular die being tested. At any one time, the pads 36 contacting pins 32 during a probing session are associated with a particular die on wafer 12 that is undergoing testing during the probing session. Accordingly, pads 36 of wafer 12 and pins 32 of probe card 28 cooperate to operate as an interface between probe card 28 and the particular die on wafer 12 undergoing testing.

Probe card 28 also includes one or more pads 38 supported on a second surface 40 of probe card 28. Pads 38 operate as an interface between probe card 28 and one or more components of testing module 18. Accordingly, probe card 28 acts an intermediary between wafer 12 and testing module 16. Although probe card 28 is described as comprising a substantially round component that includes an aperture 30 configured through the probe card 28, the configuration of probe card 28 may be dependent upon the particular type of wafer 12 undergoing probing. As a result, it is generally recognized that probe card 28 may be of any appropriate size, shape, and configuration for providing an interface between each die supported on wafer 12 and the components of testing module 18.

In particular embodiments, pads 38 operate as an interface between probe card 28 and a test head 42 of testing module 18. Test head 42 includes one or more retractable pins 44 that extend from test head 42 and contact pads 38 of probe card 28. Pins 44 allow test head 42 to gather information about each die supported on wafer 12. Thus, test head 42 may be used to read data from, write data to, and/or otherwise gather information about each die on wafer 12. For example, test head 42 may perform a functional test to determine whether each die is operating correctly. Alternatively or additionally, test head 42 may determine a stand-by current associated with each die supported on wafer 12. In particular embodiments, the stand-by current may be a measure of the amount of current leaking from the particular die in a stand-by mode of operation.

System 10 also includes control module 20 that communicates with testing module 18 and probing module 16. In the illustrated embodiment, control module 20 includes a map generator 46, a driver 48, and a relational database 50. Relational database 50 stores information in data sets that are associated with different wafers. The data sets may be indexed by identifiers particular to each wafer 12. In particular embodiments, the wafer identifier may be written to the surface of wafer 12 and may include a series of numbers, letters, and/or symbols. The wafer identifier may be used to track wafer 12 through the various semiconductor fabrication processes. Additionally, when a wafer 12 is received at probing module 16, control module 20 may read the wafer identifier from wafer 12 and may then look for an entry or data set corresponding with the wafer identifier in relational database 50. The data set associated with the particular wafer 12 may include information relating to the physical positions of each die supported on wafer 12. The data set may also include testing data gathered during previous probing sessions that were initiated on wafer 12 but were then aborted before the probing of every die on wafer 12 was completed. The prior probing sessions may have been performed by probing module 16 or by a probing system outside of system 10.

In particular embodiments, the data set associated with each wafer 12 may also include one or more flags indicating to control module 20 that wafer 12 was the subject of prior probing sessions, that testing data was obtained during these prior probing sessions, and/or that the testing data is useable.

Testing data may not be useable where the prior probing session was aborted because of a continuity fail. A continuity fail occurs when the testing equipment is unable to properly contact the particular die being tested on wafer 12. For example, where pins 32 on probe card 28 are bent or otherwise do not make contact with pads 36 on the particular die on wafer 12 that is being tested, the testing data may be unusable.

From the data stored in the data sets in relational database 50 or from data gathered directly from wafer 12 or another database outside of system 10, map generator 46 generates a probe map of wafer 12. The probe map may include a depiction or representation of all die supported on wafer 12. In particular embodiments, a probe map that includes a physical representation may be presented to an operator of system 10 on a computer monitor or other graphical user interface coupled to system 10. The operator may then be able to make decisions about the probing session before or after the probing session is initiated. Alternatively, control module 20 may use the representation to drive the probing session. In other embodiments, the probe map may include a listing of the coordinates associated with each die on wafer 12, rather than an actual physical representation of wafer 12. The listing of coordinates may also be presented to the operator of system 10 or the listing may be used by control mode 20, which directs or drives the probing session. Example probe maps are discussed below with regard to FIGS. 3A-3C.

As discussed above, control module 20 also includes a driver 48. Driver 48 is used to control or drive the operations of probe module 16. Accordingly, driver 48 includes the software necessary to generate and communicate commands to probe module 16. The commands communicated to probe module 16 may identify one or more die to be probed on wafer 12. In particular embodiments, the commands may identify the physical position of the one or more die to be probed using coordinates or another position identifier. Because the commands driving probe module 16 are originated at driver 48 of control module 20, at least a portion of the operations performed by probe module 16 are controlled externally from probe module 16. In particular embodiments and as described below with regard to FIG. 2, driver 48 may allow the operator of system 10 to select the particular die on wafer 12 to be probed when probing of the wafer is resumed. Because control module 20 and, thus, the operator of system 10 has access to information gathered about wafer 12 during previous aborted probing sessions, only the die on wafer 12 that have not been previously probed and tested need be probed in the resumed probing session.

Although an example system 10 is illustrated and described, the configuration of system 10 is provided as one example of a system for probing wafer 12 after one or more previous probing sessions have been aborted. Accordingly, the present invention contemplates any configuration appropriate for the external driving and manipulation of a probing and testing equipment. Thus, system 10 may include fewer modules or more modules than those depicted in FIG. 1. For example, any of the described modules or components may be external to system 10 and the testing equipment. Further, although illustrated as a component of control module 20, relational database 50 may be external to system 10 and/or may be accessible to other systems.

Figure 2:
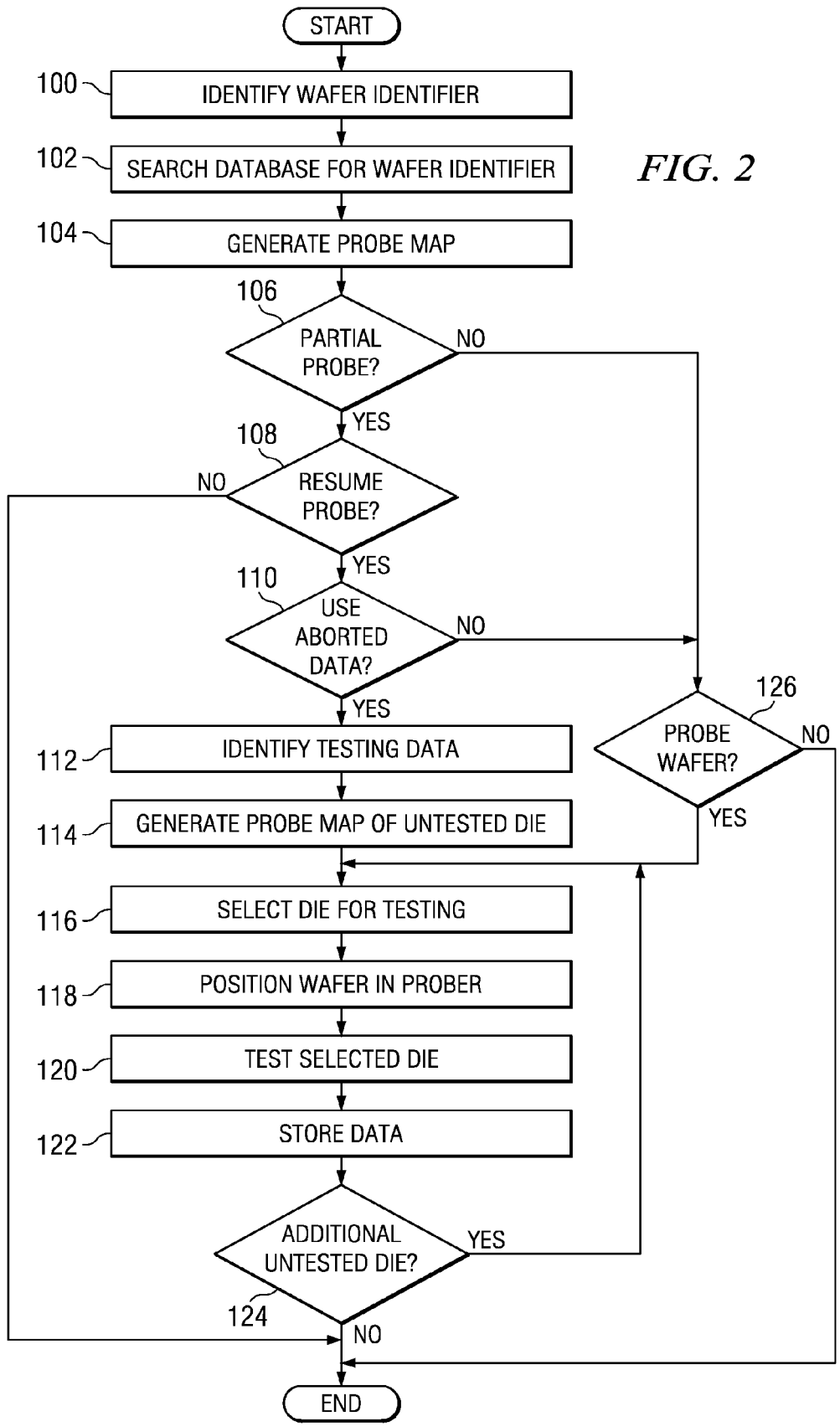
FIG. 2 is a flowchart of a method for the probing of a wafer after one or more partial probing sessions have been aborted.
Figure 3A:
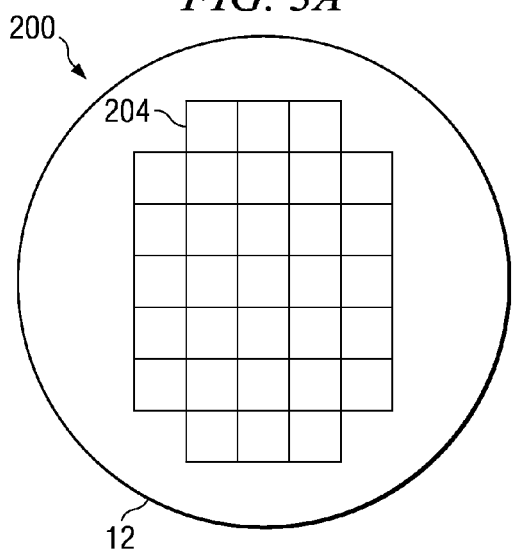
FIGS. 3A-3C include example probe maps generated for a wafer.

FIG. 2 is a flowchart of a method for probing a wafer 12, and especially for resuming the probing of wafer 12 after one or more partial probing sessions have been aborted. At step 100, a wafer identifier is identified on the surface of wafer 12. Control module 20 may then search relational database 50 to locate the wafer identifier in relational database 50 at step 102. The wafer identifier may correspond to an entry or data set in relational database 50 that includes information gathered about the particular wafer 12 during one or more previously aborted probing sessions. At step 104, a probe map is generated to identify the presence and position of all die supported on wafer 12. Map generator 46 of control module 20 may generate the probe map. FIG. 3A includes an example probe map 200 of wafer 12. Each position 204 on probe map 200 represents the presence of a die on wafer 12. Although probe map 200 is illustrated as a physical representation of wafer 12 and, more specifically, of the positions 204 of the die on wafer 12, probe map 200 may include a listing of coordinates or another position identifier for each die. Each set of coordinates may identify the position of a die supported on wafer 12. For example, in particular embodiments, an x-coordinate and a y-coordinate may be assigned to each die on wafer 12.

Returning to FIG. 2, a determination may be made at step 106 as to whether wafer 12 has been the subject of one or more partial probing sessions that were aborted before the probing of every die on wafer 12 was completed. The determination may be made by control module 20. In particular embodiments, control module 20 may identify a first flag in the data set associated with wafer 12. The first flag may indicate to control module 20 that testing data has been aborted for one or more die on wafer 12 in a prior probing session. In other embodiments, control module 20 may independently determine that testing data in the data set corresponds to one or more die supported on wafer 12.

Where such testing data is identified, the method may continue at step 108 where it is determined whether or not the probing of wafer 12 should be resumed. In particular embodiments, control module 20 may present the option to an operator of system 10 on a computer monitor or other graphical user interface. Alternatively, control module 20 may independently determine whether the probing of wafer 12 should be resumed in a new probing session based on information in the data set or other information made known to control module 20. If it is determined at step 108 that the probing of wafer 12 should not be resumed, the method terminates. On the other hand, if it is determined that the probing of wafer 12 should be resumed, the method continues to step 110.

At step 110, a determination is made as to whether the testing data gathered during the one or more prior probing sessions and stored in the data set in relational database 50 is useable. The determination may be made by control module 20. In particular embodiments, control module 20 may identify a second flag in the data set associated with wafer 12. The second flag may indicate to control module 20 that the testing data is useable. The second flag may be included in the data set as a result of an operator determination that the testing data is valid and useable. The operator determination may have been made when the previous probing session was aborted. In other embodiments, control module 20 may independently determine whether the testing data is useable by examining the testing data or by questioning a current operator of system 10. In still other embodiments, control module 20 may assume that the testing data is useable and step 110 may be omitted.

Figure 3B:
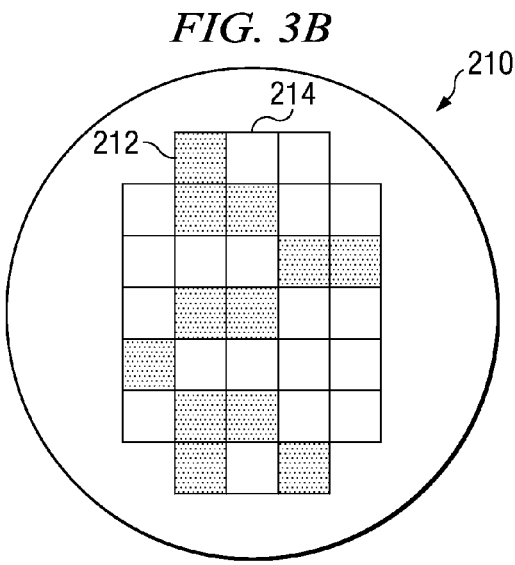

If it is determined at step 110 that the testing data is useable, the testing data is identified in the data set at step 112. FIG. 3B includes an example probe map 210 that differentiates between the one or more die on wafer 12 that have been previously probed and the one or more die on wafer 12 that have not been previously probed. Accordingly, probe map 210 includes probed positions 212 and unprobed positions 214. Probed positions 212 correspond with each die supported on wafer 12 that was probed in one or more previous probing sessions. Additionally, a probed position 212 may also indicate that relational database 50 contains useable testing data for the particular die at probed position 212. Unprobed positions 214 correspond with each die that was not probed in the one or more previous probing sessions and each die for which useable testing data is not stored in relational database 50. Similar to probe map 200, probe map 210 is illustrated as a physical representation of probed positions 212 and unprobed positions 214. Probe map 210 may comprise, however, a listing of coordinates or other position indicators corresponding to probed positions 212 and a listing of the coordinates or other position indicators corresponding to unprobed positions 214. In particular embodiments, a set of coordinates including an x-coordinate and a y-coordinate may be assigned to each die on wafer 12. Accordingly, probe map 210 may include listings of probed positions 212 and unprobed positions 214, each identified by the appropriate coordinates for the one or more die listed.

Figure 3C:
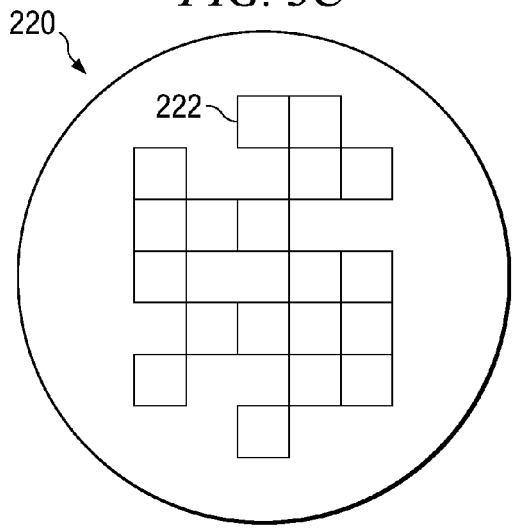

Returning to FIG. 2, a probe map of the one or more untested die supported on wafer 12 is generated at step 114. FIG. 3C includes an example probe map 220 of wafer 12. Each position 222 on probe map 220 represents the presence of a die that has not been probed in a previous aborted probing session or a die for which no useable testing data was obtained in the prior probing session. Accordingly, each position 222 represents only a die on wafer 12 for which testing data is needed. Although probe map 220 is illustrated as a physical representation of positions 222 on wafer 12, in alternative embodiments, probe map 220 may include a listing of coordinates or other position identifiers corresponding to positions 222 on wafer 12.

Returning to FIG. 2, a die is selected for testing at step 116. In particular embodiments, control module 20 may select a die to be tested from probe map 222. In other embodiments, control module 20 may present the operator of system 10 with the option of selecting the next die to be tested using a computer monitor or other graphical user interface. At step 118, the wafer is positioned in probing module 16. In particular embodiments, control module 20 may communicate the generated probe map 220 and/or one or more commands to probe module 16. The commands may identify the next die on wafer 12 or the next sequence of two or more die on wafer 12 to be tested. In response to receiving probe map 220 and any accompanying commands, chuck 26 of probe module 16 may be used to position the selected die in the testing position. As described above with regard to FIG. 1, positioning the selected die in the testing position may include positioning the selected die proximate a probe card 28 such that one or more pins 32 are aligned with and contact pads 36 on the selected die. Accordingly, the testing position may enable probe card 28 to act as an interface between wafer 12 and testing module 10.

At step 120, the selected die is tested. In particular embodiments, testing module 18 may be used to read data from, write data to, and/or otherwise gather information about the selected die supported on wafer 12. For example, test head 42 may perform a functional test to determine whether the selected die is operating correctly. Additionally, test head 42 may determine a stand-by current associated with the selected die or may gather other information specific to the selected die. The data gathered during the resumed probing session may be stored in relational database 50 at step 122. In particular embodiments, the testing data may be added to the data set associated with the particular wafer 12 already stored in relational database 50. Stated differently, the data gathered in the resumed probing session may be added to any data gathered in previous aborted probing sessions.

At step 124, a determination is made as to whether additional untested die exist on wafer 12. Control module 20 may make the determination by referring to probe map 220 or by querying the operator of system 10. Alternatively, probe module 20 may make the determination by referring to probe map 220 or to any commands communicated from control module 20. Where it is determined that wafer 12 includes additional untested die, the method returns to step 116. The method then cycles through steps 116 through 120 until each untested die on wafer 12 is tested or until the resumed probing session is aborted, whichever occurs first. After each die on wafer 12 is tested or the probing session is aborted, the method terminates.

Returning to step 106, if it is determined at step 106 that wafer 12 has not been the subject of one or more partial probing sessions, the method continues at step 126. Similarly, if at step 110, it is determined that the testing data gathered during the one or more previous aborted probing sessions is not useable, the method continues at step 126. At step 126, it is determined whether wafer 12 is to be probed. Control module 20 may make the determination independently, or control module 20 may make the determination by presenting the option to an operator of system 10 using a computer screen or other graphical user interface. If wafer 12 is to be probed, the method returns to step 116, where a die on wafer 12 is selected for testing. The method then continues cycling through steps 116 through 124 until each die on wafer 12 is tested or until the probing session is aborted, whichever occurs first. After each die on wafer 12 is tested or the probing session is aborted, the method terminates.

Although example steps are illustrated and described, the present invention contemplates two or more steps taking place substantially simultaneously or in a different order. In addition, the present invention contemplates using methods with additional steps, fewer steps, or different steps, so long as the steps remain appropriate for the probing of a wafer after one or more prior probing sessions have been aborted.

Figure 4:
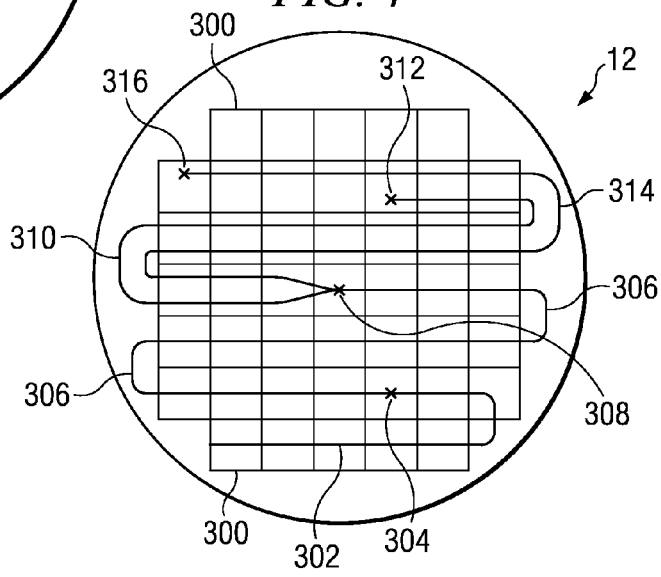
FIG. 4 is a wafer on which multiple probing sessions have been initiated and then aborted before probing of the wafer is complete.

As described above with regard to FIG. 2, a single wafer 12 may be the subject of multiple incomplete probing sessions. Thus, multiple probing sessions may be initiated on a single wafer 12 and then aborted before the probing of wafer 12 is complete. For each probing session, information may be gathered regarding the one or more die supported on wafer 12. The testing data obtained from each aborted probing session may be merged in relational database 50. Accordingly, the data set for a wafer 12 may include testing data obtained from multiple probe passes. A probe pass identifies the particular die tested during each probing session and the order in which each die was tested. Typically, the order in which each die was tested is determined by the positions of each die on wafer 12. As illustrated in FIG. 4, wafer 12 has been the subject of four partial probing sessions. Accordingly, four probe passes identify the die 300 on wafer 12 that were tested during each of the four probing sessions.

A first probe pass 302 identifies the one or more die 300 that were tested in a first probing session. In the illustrated example, first probe pass 302 indicates that eight of the die 300 were tested during the first partial probing session. First probe pass 302 was aborted at a first termination point 304. Following the termination of the first probing session, the data generated by first pass 302 may be stored in relational database 50. Because the data associated with the testing of the die 300 corresponding to first termination point 304 may be invalid or unusable, however, a flag may be attached to the data set in relational database 50 to indicate to control module 20 that only the data generated from the first seven of the die 300 tested during first pass 302 is useable.

A second probe pass 306 indicates that at some point the probing of wafer 12 was resumed in a second probing session. Because control module 20 of system 10 is able to identify a data set in relational database 50 that corresponds with wafer 12, the probing of wafer 12 was resumed at the die 300 that corresponds to the first die 300 after first termination point 304. It is recognized, however, that the probing of wafer 12 may be resumed at any other unprobed die 300 on wafer 12. Similar to first probe pass 302, second probe pass 306 identifies the one or more die 300 that were tested in the second probing session. In the illustrated example, the second probing session was terminated at a second termination point 308. Thus, second probe pass 306 indicates that fifteen of the die 300 were probed during the second probing session. The fifteen of the die 300 probed include the particular die corresponding with the first die after first termination point 304 and the die corresponding with second termination point 308. Following the termination of the second probing session, the data generated by second pass 306 may be stored in relational database 50. A flag may be attached to the data set in relational database 50 to indicate to control module 20 that only the data generated from the fifteen of the die 300 tested during second pass 306 is useable.

A third probe pass 310 indicates that at some point the probing of wafer 12 was resumed in a third probing session. Because control module 20 of system 10 is able to identify a data set in relational database 50 that corresponds with wafer 12, the probing of wafer 12 was resumed at the particular die 300 that corresponds to the first die 300 after second termination point 308. It is recognized, however, that the probing of wafer 12 may be resumed at any other unprobed die 300 on wafer 12. Similar to first and second probe passes 302 and 306, third probe pass 310 identifies the one or more die 300 that were tested in the third probing session. In the illustrated example, the third probing session was terminated at a third termination point 312. Thus, third probe pass 310 indicates that thirteen of the die 300 were probed during the third probing session. The thirteen of the die 300 probed include the die corresponding with the first die 300 after second termination point 308 and the die corresponding with third termination point 312. Following the termination of the third probing session, the data generated by third pass 310 may be stored in relational database 50. For example purposes, it may be assumed that third pass 310 was aborted because of a continuity failure or another failure of system 10 that renders the data gathered during third pass 310 unusable. As such, the data gathered for each die 300 tested during the third probing session may be flagged as unusable in the data set stored in relational database 50.

A fourth probe pass 314 indicates that at some point the probing of wafer 12 was resumed in a fourth probing session. Because control module 20 of system 10 is able to identify that the testing data relating to the one or more die tested during the third probing session was unusable, the probing of wafer 12 was again resumed at the particular die 300 corresponding to the first die 300 after second termination point 308. It is recognized, however, that the probing of wafer 12 may be resumed at any other die 300 for which useable testing data is not stored in relational database 50. Similar to first, second, and third probe passes 302, 306 and 310, fourth probe pass 314 identifies the one or more die 300 that were tested in the fourth probing session. In the illustrated example, the fourth probing session was terminated at a fourth termination point 316. Thus, fourth probe pass 314 indicates that seventeen of the die 300 were probed during the fourth probing session. The seventeen of the die 300 probed include the particular die corresponding with the first die 300 after second termination point 308 and the particular die corresponding with fourth termination point 316. Following the termination of the fourth probing session, the data generated by fourth pass 314 may be stored in relational database 50. A flag may be attached to the data set in relational database 50 to indicate to control module 20 that the data generated from the seventeen of the die 300 tested during fourth pass 306 is useable.

In summary, a system and method for probing a wafer 12 after one or more prior probing sessions are aborted is provided. The system and method include a control module 20 that operates independently of probing module 16 to utilize data that was gathered in earlier aborted probing sessions. Since the data generated from the previously aborted probing sessions may be stored in relational database 50, a probe map may be easily and quickly generated to identify each die that has not been tested and each die for which no useable data is stored. Because relational database 50 may be available to multiple systems for probing and testing wafer 12, the probing of wafer 12 may be resumed using different probing and testing equipment than that which was used in the prior aborted probing sessions. After multiple partial probing sessions are performed and the probing of wafer 12 is complete, the data gathered from each partial probing session may be merged in relational database 50 for reporting purposes.

Although embodiments of the invention and their advantages are described in detail, a person skilled in the art could make various alterations, additions, and omissions without departing from the spirit and scope of the present invention, as defined by the appended claims.

What is claimed is:

1. A system for probing a wafer comprising:
a control module operable to:
    identify a data set associated with a wafer, the data set identifying at least one unprobed die supported on the surface of the wafer;
    determine that the data set associated with the wafer is useable;
    generate a probe map of the wafer from the data set, the probe map identifying a physical position associated with each unprobed die supported on the surface of the wafer; and
    communicate the probe map and one or more probe commands to drive a resumed probing session of the wafer;
a probe module operable to:
    receive the probe map and the one or more probe commands from the control module;
    position the wafer proximate to a testing module to initiate the resumed probing session of the wafer, the position of the wafer determined by the one or more probe commands.

2. The system of claim 1, wherein the control module is further operable to:
receive an identifier associated with the wafer;
search a database for the identifier associated with the wafer to locate the data set associated with the wafer, the data set comprising information about a plurality of probe passes performed during one or more prior probing sessions; and determine whether the information about each of the plurality of probe passes is useable.

3. The system of claim 1, wherein when generating a probe map of the wafer the control module is further operable to:

generate a first mapping of the wafer, the first mapping identifying one or more probed die supported on the surface of the wafer and each unprobed die supported on the surface of the wafer; and extract each probed die from the first mapping to generate a second mapping of the substrate, the second mapping including only the unprobed die that are supported on the surface of the wafer.

4. The method of claim 1, wherein:

the physical position associated with each unprobed die comprises a set of coordinates identifying the location of each unprobed die on the wafer; and when communicating the one or more probe commands to a probe module to drive the probe module the control module is further operable to communicate a set of coordinates to the probe module identifying the location of a selected unprobed die.

\* \* \* \* \*